United States Patent
Jeong et al.

(10) Patent No.: US 7,482,264 B2
(45) Date of Patent: Jan. 27, 2009

(54) METHOD OF FORMING METAL LINE OF SEMICONDUCTOR DEVICE, AND SEMICONDUCTOR DEVICE

(75) Inventors: Cheol Mo Jeong, Icheon-Si (KR); Seong Hwan Myung, Suwon-si (KR); Eun Soo Kim, Incheon-Si (KR); Suk Joong Kim, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/604,484

(22) Filed: Nov. 27, 2006

(65) Prior Publication Data

US 2008/0105983 A1    May 8, 2008

(30) Foreign Application Priority Data

Sep. 29, 2006    (KR) ............... 10-2006-0096144

(51) Int. Cl.
*H01L 21/283* (2006.01)
(52) U.S. Cl. .................. 438/629; 438/622; 438/678; 438/627; 438/625; 257/774; 257/E23.145
(58) Field of Classification Search ........... 257/751, 257/214, E21.169, E21.17, E21.584; 438/653, 438/654, 128, 570, 580–583, 625, 678, 622, 438/627, 643
See application file for complete search history.

(56) References Cited

U.S. PATENT DOCUMENTS

| | | | | |
|---|---|---|---|---|
| 6,879,044 | B2* | 4/2005 | Thakur | 257/751 |
| 2001/0035241 | A1* | 11/2001 | Ohto | 148/584 |
| 2003/0003721 | A1* | 1/2003 | Fortin | 438/653 |
| 2005/0031786 | A1* | 2/2005 | Lee et al. | 427/255.28 |
| 2005/0199489 | A1* | 9/2005 | Stevens et al. | 204/275.1 |
| 2006/0078679 | A1* | 4/2006 | Elers et al. | 427/248.1 |

FOREIGN PATENT DOCUMENTS

| | | |
|---|---|---|
| KR | 10-1999-0006109 A | 1/1999 |
| KR | 10-2000-0025452 A | 5/2000 |
| KR | 10-0290467 B1 | 3/2001 |
| KR | 10-2002-0016312 A | 3/2002 |
| KR | 10-2006-0079486 | 7/2006 |

* cited by examiner

*Primary Examiner*—Evan Pert
*Assistant Examiner*—Selim Ahmed
(74) *Attorney, Agent, or Firm*—Marshall, Gerstein & Borun LLP

(57) ABSTRACT

A semiconductor device includes a first barrier metal layer and a second barrier metal layer, a third barrier metal layer, and a metal line. The first barrier metal layer and the second barrier metal layer are formed and on a top surface of an insulating layer over a semiconductor substrate on the bottom surface of trenches formed in the insulating layer. The third barrier metal layer is formed on sidewalls of trenches. The metal line gap-fills the trenches. In a method of forming a metal line of a semiconductor device, trenches are formed within an insulating layer over a semiconductor substrate. A first barrier metal layer and a second barrier metal layer are formed on a bottom surface of the trenches and on a top surface of the insulating layer. A third barrier metal layer is formed on sidewalls of trenches. A metal line gap-fills the trenches.

19 Claims, 3 Drawing Sheets

METHOD OF FORMING METAL LINE OF SEMICONDUCTOR DEVICE, AND SEMICONDUCTOR DEVICE

BACKGROUND OF THE INVENTION

1. Field of the Invention

The invention relates generally to semiconductor devices and, more particularly, to a method of forming a metal line of a semiconductor device, in which the volume fraction of the metal line can be maximized and the grain size of the metal layer can be increased, thereby improving the sheet resistance Rs of the metal line.

2. Related Technology

In general, a metal line of a semiconductor device is formed by means of a damascene scheme.

A process of forming the metal line of the semiconductor device using the damascene scheme is briefly described as follows.

An interlayer insulating layer is first deposited on a semiconductor substrate in which selected structures, such as a gate, are formed. Trenches are then formed, and a barrier metal layer of Ti/TiN is formed over the interlayer insulating layer including the trenches. A tungsten layer is formed over the barrier metal layer in such a way to gap-fill the trenches. Selected regions of the tungsten layer and the Ti/TiN barrier metal layer are etched to form a tungsten metal line.

As semiconductors products have become miniaturized and more highly integrated, the pitch of the metal line has decreased in size. Accordingly, when the metal line is formed by a general damascene structure in devices of 70 nm and 60 nm, the following problems are generated.

Firstly, in the case where a metal line is formed by a single damascene structure, the volume of a tungsten layer is decreased by means of a region occupied by a barrier metal layer within the trenches. Accordingly, a problem occurs since the resistance of the metal line increases.

Secondly, in the case where tungsten is deposited on an insulating layer, a lifting phenomenon is generated between the insulating layer and tungsten due to an adhesion problem. In order to prevent the problem, titanium (Ti) and titanium nitride (TiN) are laminated between the insulating layer and tungsten. However, when a tungsten nucleus is generated on the TiN layer, a large number of nuclei are created. Thus, the grain growth is rapid, but the grain size is decreased, resulting in an increased sheet resistance Rs.

Thirdly, in the case where a metal line is formed using a dual damascene structure, reduction of the target thickness of a barrier metal layer is limited due to junction resistance when the thickness of the barrier metal layer is reduced.

Attempts have been made to secure the resistance of the metal line by reducing the thickness of the barrier metal layer in order to solve the conventional problems. However, a reduction in the thickness of the barrier metal layer has reached a limit at 60 nm or less. Another attempt was made to improve the resistance characteristic of the metal line by minimizing a nucleus creation target of tungsten with a high resistivity. However, a reduction in tungsten nucleus creation has reached limitation at 60 nm or less.

SUMMARY OF THE INVENTION

The invention provides a semiconductor device and a method of forming a metal line of a semiconductor device, in which the volume fraction of the metal line can be maximized and the grain size of the metal layer can be increased, thereby improving the sheet resistance Rs of the metal line.

In one embodiment, a semiconductor device includes a first barrier metal layer and a second barrier metal layer formed on a bottom surface of a trench in an insulating layer over a top surface of an insulating layer over a semiconductor substrate, a third barrier metal layer formed on sidewalls of trenches, and a metal line gap-filling the trenches.

In another embodiment, a method of forming a metal line of a semiconductor device includes the steps of forming trenches within an insulating layer over a semiconductor substrate, forming a first barrier metal layer and a second barrier metal layer on a bottom surface of the trenches and on a top surface of the insulating layer, forming a third barrier metal layer on sidewalls of trenches, and forming a metal line gap-filling the trenches.

DESCRIPTION OF SPECIFIC EMBODIMENTS

Specific embodiments of the invention are described briefly with reference to the accompanying drawings.

FIGS. 1a to 1f are cross-sectional views for illustrating a method of forming a metal line of a semiconductor device according to an embodiment of the invention.

Figure 1A:
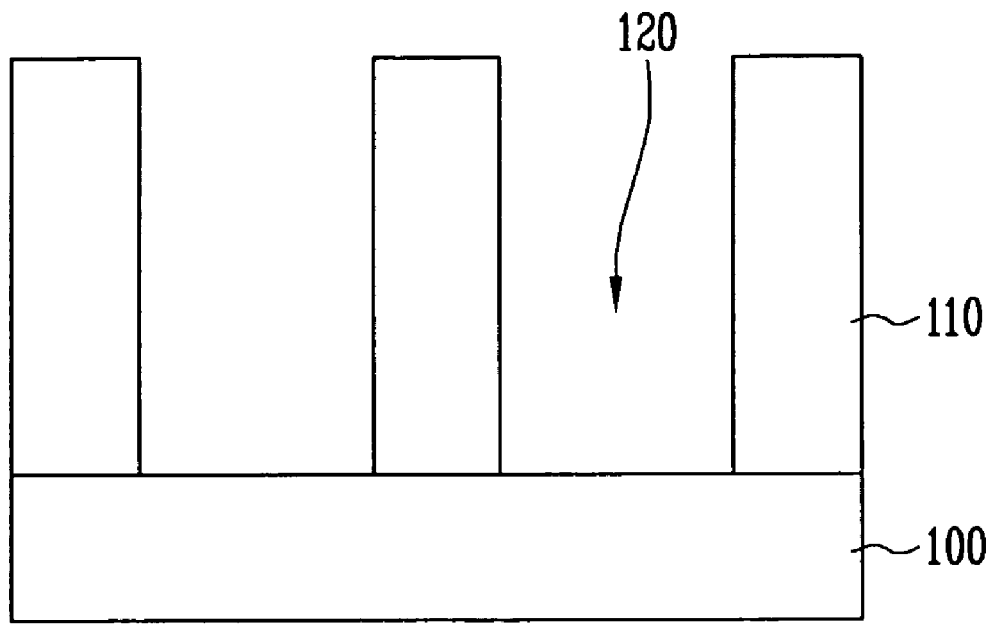
FIGS. 1a to 1f are cross-sectional views for illustrating a method of forming a metal line of a semiconductor device according to an embodiment of the invention.

Referring FIG. 1a, an insulating layer 110 is formed over a semiconductor substrate 100 in which selected structures, such as a gate, though not shown in the drawing, are formed. The insulating layer 110 is preferably formed from Boron Phosphorous Silicate Glass (BPSG) by means of a Chemical Vapor Deposition (CVD) method.

The insulating layer 110 may further include a polishing process, preferably employing CMP, in order to polish the substrate.

Trenches 120 are formed within the insulating layer 110 by means of etching using a mask (not shown). The trenches are spaced apart from each other at regular intervals.

It is preferred that the trenches 120 be formed to have a vertical profile in order to maximize the volume increase of metal lines formed in a subsequent process.

After the trenches 120 are formed, a cleaning process is preferably carried out in order to remove particles and other organic contaminants generated on the semiconductor substrate 100 when the trenches 120 are formed.

Figure 1B:
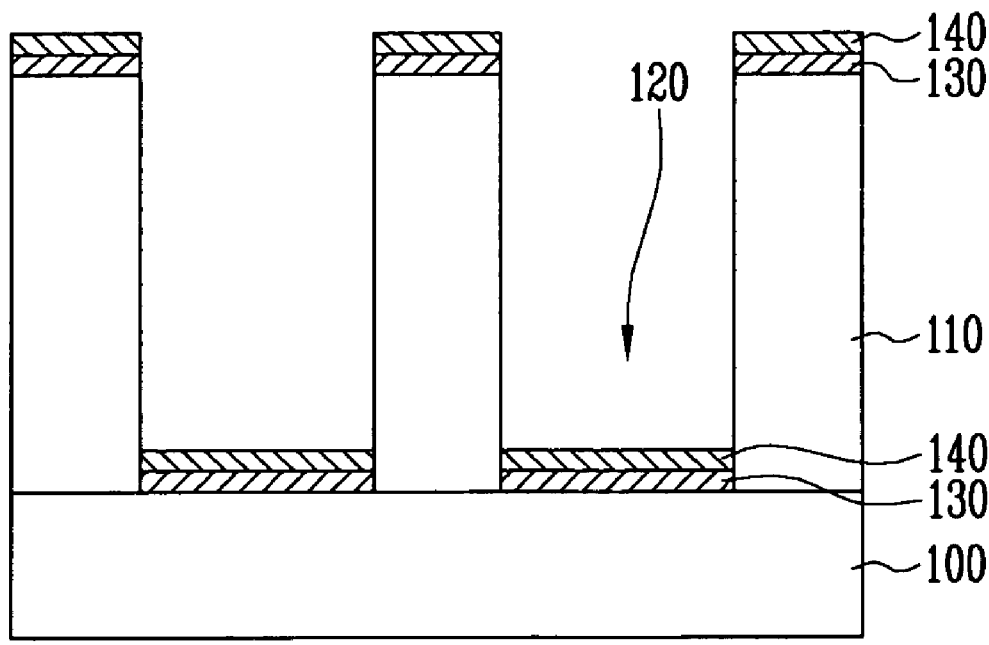

Referring to FIG. 1b, in order to improve adhesive force with the semiconductor substrate 100 and prevent a metal line (not shown) formed in a subsequent process from diffusing into the semiconductor substrate 100, a first barrier metal layer 130 and a second barrier metal layer 140 are sequentially formed on the bottom surfaces of the trenches 120 and on the top surface of the insulating layer 110. The first barrier metal layer 130 is preferably formed of Ion Metal Plasma (IMP) Ti to a thickness of 20 Å to 200 Å by means of an IMP method in order to improve the resistance of a metal line (not shown) formed in a subsequent process.

If the first barrier metal layer 130 is formed by the IMP method as described above, IMP Ti is rarely formed on the sidewalls of the trenches 120, thereby reducing an area occupied by the first barrier metal layer 130 within the trenches 120. It is therefore possible to maximize the volume faction of a metal line formed in a subsequent process.

In contrast, the second barrier metal layer 140 is preferably formed from TiN to a thickness of 20 Å to 100 Å. The second barrier metal layer 140 is preferably formed by performing a Rapid Thermal Nitration (RTN) process or a furnace annealing process on the semiconductor substrate 100 over which the first barrier metal layer 130 is formed. It is preferable that the second barrier metal layer 140 is formed by means of the RTN process.

The RTN process is preferably performed in a temperature range of 450° C. to 700° C. for 10 seconds to 60 minutes. The higher the RTN process temperature, the shorter the process time.

As described above, in the illustrated exemplary embodiment, the second barrier metal layer 140 is formed only on the first barrier metal layer 130 by using the RTN process. Thus, the second barrier metal layer 140 can be prohibited from being formed on the sidewalls of the trenches 120, and, therefore, the area occupied by the second barrier metal layer 140 within the trenches 120 can be reduced. Accordingly, the volume fraction of a metal line formed in a subsequent process can be maximized.

Figure 1C:
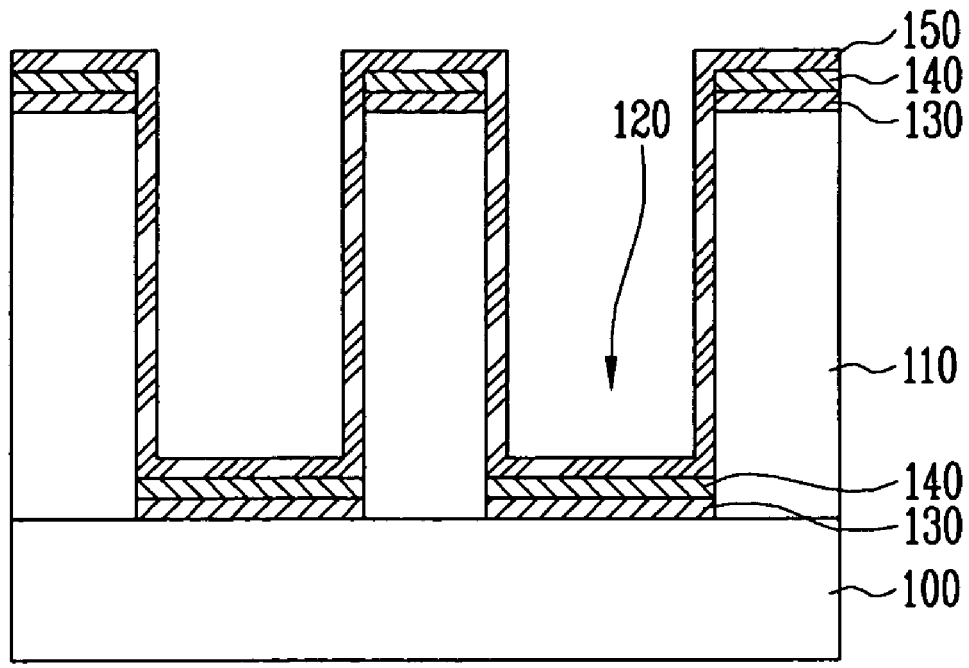

Referring to FIG. 1c, a third barrier metal layer 150 is formed over the semiconductor substrate 100 including the first and second barrier metal layers 130 and 140.

The third barrier metal layer 150 is preferably formed by means of a Metal Organic Chemical Vapor Deposition (MOCVD) method. The third barrier metal layer 150 is preferably formed from amorphous TiNC by use of a precursor.

The third barrier metal layer 150 is preferably formed to a thickness of 10 Å to 100 Å in order to minimize an area occupied in the sidewalls of the trenches 120.

The MOCVD method is preferably carried out in a pressure range of 1.0 torr to 3.0 torr and a temperature range of 300° C. to 500° C. The MOCVD method is preferably performed using He and $N_2$ gases. The flow rate of He is preferably in a range of 100 sccm to 500 sccm, and the flow rate of $N_2$ preferably ranges from 100 sccm to 500 sccm.

In accordance with the illustrated embodiment, after the RTN process is performed, the third barrier metal layer 150 may be deposited in order to prevent the crystallization of the second barrier metal layer 140. Therefore, a metal line having a low sheet resistance can be formed in a subsequent process.

Figure 1D:
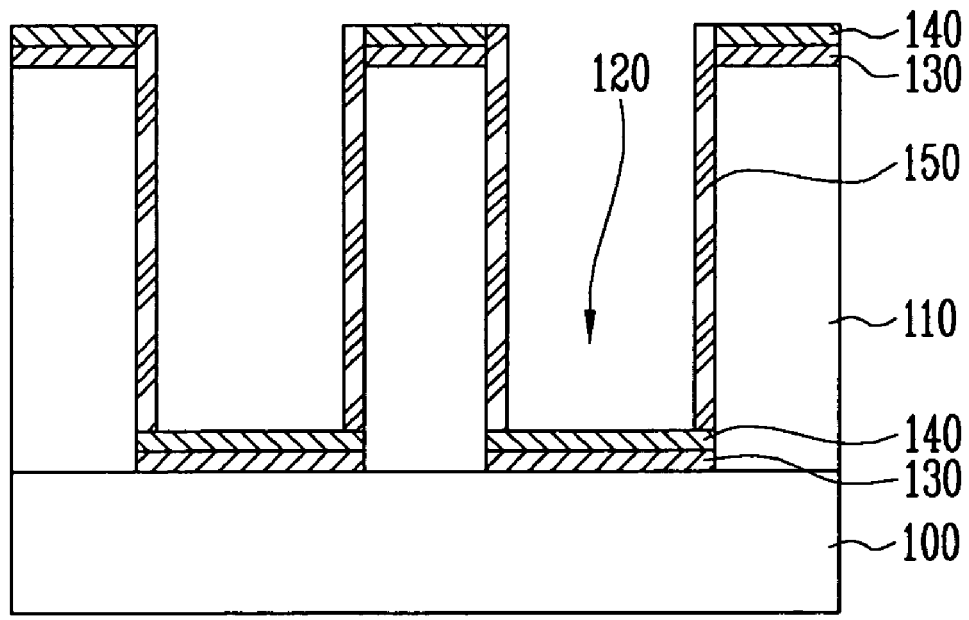

Referring to FIG. 1d, a plasma treatment process is excessively performed on the semiconductor substrate 100 over which the third barrier metal layer 150 is formed, thereby removing the third barrier metal layer 150 over the second barrier metal layer 140 formed within the insulating layer 110 and the trenches 120.

The plasma treatment process is preferably performed under the conditions including RF power of 500 W to 1000 W, pressures of 1.0 torr to 3.0 torr, and a temperature range of 300° C. to 500° C. The plasma treatment process is preferably performed using He and $N_2$ gases. The flow rate of He preferably ranges from 100 sccm to 500 sccm, and the flow rate of $N_2$ preferably ranges from 100 sccm to 500 sccm.

Meanwhile, at the time of the plasma treatment process, the third barrier metal layer 150 formed on the sidewalls of the trenches 120 is also etched to a given thickness. Consequently, the third barrier metal layer 150 remains only on the sidewalls of the trenches 120.

In particular, the third barrier metal layer 150 formed on the sidewalls of the trenches 120 has an improved film quality through the plasma treatment process, and is therefore advantageous in creating a nucleus for forming a metal line in a subsequent process.

Figure 1E:
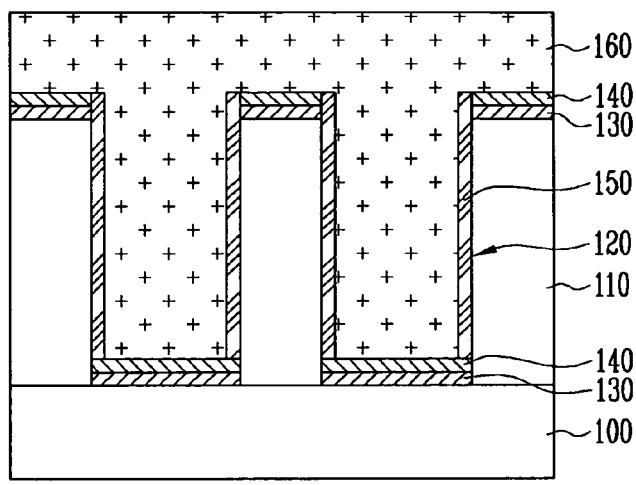

Referring to FIG. 1e, a metal layer 160 is formed over the semiconductor substrate 100 including the first, second, and third barrier metal layers 130, 140, and 150, respectively, such that the trenches 120 are gap-filled. The metal layer 160 is preferably formed in-situ using tungsten (W) with a low resistance.

In the process of forming the tungsten layer within the trenches 120, a nucleus is formed on the third barrier metal layer 150 formed of TiNC. The tungsten layer is formed using the nucleus as a seed. A method of creating the tungsten nucleus preferably is selected from a LRW method, a Pulsed Nucleation Layer (PNL) method or an Atomic Layer Deposition (ALD) method. Preferably, the metal layer 160 is formed by a Low Rs W (LRW) method. A method of creating the tungsten nucleus using the LRW method is described below.

A nucleus is preferably generated by sequentially spraying a first $B_2H_6/WF_6$ gas, a $SiH_4/WF_6$ gas, and a second $B_2H_6/WF_6$ gas over the semiconductor substrate. The first $B_2H_6/WF_6$ gas and the $SiH_4/WF_6$ gas are preferably sprayed in a temperature range of 250° C. to 400° C., and the second $B_2H_6WF_6$ gas is preferably sprayed in a temperature range of 350° C. to 450° C. In this case, the process of spraying the first and second $B_2H_6/WF_6$ gases is preferably performed once, whereas the process of spraying the $SiH_4/WF_6$ gas is preferably performed once to five times in order to control a tungsten nucleus creation target. At the time of the second $B_2H_6/WF_6$ gas spray process, tungsten of an amorphous state or a tungsten nucleus of a β state is generated. If tungsten of the amorphous state or the tungsten nucleus of the β state is used as a seed, grain size can be increased when forming the tungsten layer.

After the tungsten nucleus is generated, a tungsten layer is formed, preferably using a $H_2$ gas. The tungsten layer is preferably formed in a temperature range of 350° C. to 450° C.

In the illustrated embodiment, when the tungsten nucleus is generated, the tungsten nucleus is generated on TiNC (i.e., the third barrier metal layer 150) formed on the sidewalls of the trenches 120. In this case, a small number of tungsten nuclei are generated compared with when a nucleus is formed on TiN. Accordingly, the grain size of tungsten can be increased, and the sheet resistance of the metal line can be improved accordingly.

Furthermore, in the illustrated embodiment, since the area occupied by the first, second and third barrier metal layers 130, 140, and 150, respectively, within the trenches 120 is small, the volume fraction of the metal layer 160 can be maximized. Therefore, the volume fraction of a metal line formed in a subsequent process can be maximized, and the sheet resistance Rs of the metal line can be improved accordingly.

Figure 1F:
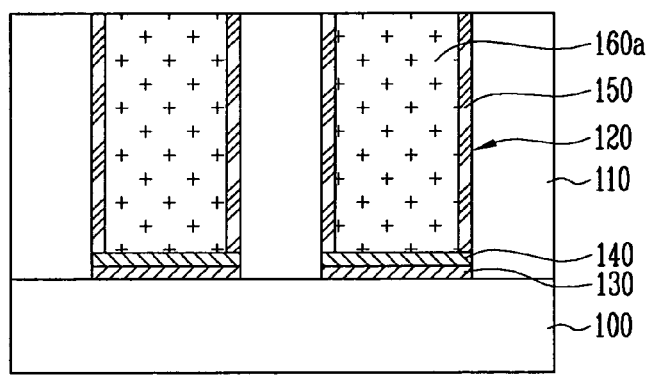

Referring to FIG. 1f, the metal layer 160 is polished so that a top surface of the insulating layer 110 is exposed, thus forming a metal line 160a gap-filled into the trenches 120. The polishing process is preferably a CMP process.

Figure 2:
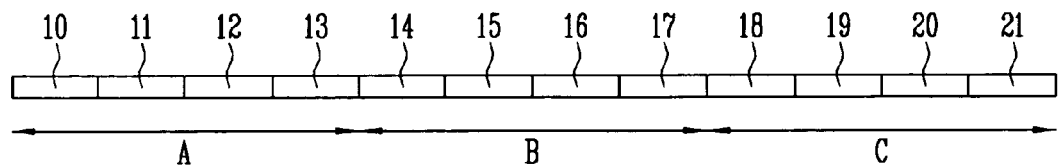
FIG. 2 is a view illustrating a Low Rs W (LRW) method applied to the invention.

FIG. 2 is a view illustrating the LRW method applied to the invention.

Referring to FIG. 2, the LRW method illustratively includes performing the processes of (10) supplying a $B_2H_6$ source gas, thus chemically adsorbing a source of one layer on the surface of a wafer, (11) purging physically adsorbed excessive sources by flowing a purge gas, (12) supplying a $WF_6$ reaction gas to the source of one layer so that a desired tungsten nucleus is formed through a chemical reaction of the source of one layer and the reaction gas, and (13) purging excessive reaction gases by flowing a purge gas. The process is referred to as a "first cycle A." The first cycle A is preferably performed only once.

After the first cycle A is performed, the LRW method illustratively includes performing the processes of (14) supplying a $SiH_4$ source gas in order to chemically absorb the source of one layer on the surface of the wafer, (15) purging physically adsorbed excessive sources by flowing a purge gas, (16) supplying the $WF_6$ reaction gas to the source of one layer in order to obtain a desired tungsten nucleus through a chemical reaction of the source of one layer and the reaction gas, and (17) purging excessive reaction gases by flowing a purge gas. The process is referred to a "second cycle B." The second cycle B is preferably performed once to five times in order to control the tungsten nucleus creation target.

After the second cycle B is performed, the LRW method illustratively includes performing the processes of (18) supplying the $B_2H_6$ source gas in order to chemically absorbing the source of one layer on the surface of the wafer, (19) purging physically adsorbed excessive sources by flowing a purge gas, (20) supplying the $WF_6$ reaction gas to the source of one layer in order to obtain a desired tungsten nucleus through a chemical reaction of the source of one layer and the reaction gas, and (21) purging excessive reaction gases by flowing a purge gas. The process is referred to as a "third cycle C." The third cycle C is preferably performed once.

The method according to the illustrated embodiment can be applied to not only a method of forming a metal line using a single damascene process or a dual damascene process, but also other device fabrication techniques for implementing DRAM, SRAM, flash memory devices, micro conductor circuit lines and so on.

As described above, according to the invention, after the IMP Ti barrier metal is deposited, the TiN barrier metal layer is deposited on the IMP Ti barrier metal preferably by means of the RTN process. Accordingly, the area occupied by the barrier metal layer within the trenches can be reduced, and the volume fraction of a metal line within the trenches can be maximized. Therefore, the sheet resistance Rs of the metal line can be improved.

Furthermore, according to the invention, when a tungsten nucleus is generated within the trenches, the tungsten nucleus is not generated on TiN (i.e., the barrier metal layer), but is generated on TiNC (i.e., the barrier metal layer) formed on the sidewalls of the trenches. Accordingly, there are advantages in that the grain size of a tungsten layer can be increased, and the sheet resistance Rs of a metal line can be improved.

The described embodiments of the invention are illustrative and not limiting. Various alternatives and equivalents are possible. Other additions, subtractions, or modifications are obvious in view of the disclosure and are intended to fall within the scope of the appended claims.

What is claimed is:

1. A method of forming a metal line of a semiconductor device, comprising:
   forming trenches within an insulating layer over a semiconductor substrate;
   forming a first barrier metal layer and a second barrier metal layer on a bottom surface of the trenches and on a top surface of the insulating layer;
   forming a third barrier metal layer on sidewalls of the trenches to expose the second barrier metal layer; and
   forming a metal line contacting the second barrier metal layer in the trenches and gap-filling the trenches.

2. The method of claim 1, comprising forming the first barrier metal layer of Ion Metal plasma (IMP) Ti.

3. The method of claim 1, comprising forming the first barrier metal layer to a thickness of 20 Å to 200 Å.

4. The method of claim 1, comprising forming the second barrier metal layer of TiN.

5. The method of claim 1, comprising forming the second barrier metal layer to a thickness of 20 Å to 100 Å.

6. The method of claim 1, comprising forming the second barrier metal layer by performing a Rapid Thermal Nitration (RTN) process or a furnace annealing process on the semiconductor substrate over which the first barrier metal layer is formed.

7. The method of claim 6, comprising performing an RTN process in a temperature range of 450° C. to 700° C.

8. The method of claim 6, comprising performing an RTN process for 10 seconds to 60 minutes.

9. The method of claim 1, comprising forming the third barrier metal layer of TiNC.

10. The method of claim 1, comprising forming the third barrier metal layer by a Metal Organic Chemical Vapor Deposition (MOCVD) method.

11. The method of claim 1, comprising forming the third barrier metal layer to a thickness of 10 Å to 100 Å.

12. The method of claim 1, comprising forming the third barrier metal layer by depositing a metal layer on the entire surface including the second barrier metal layer, and performing a plasma treatment process.

13. The method of claim 12, comprising performing the plasma treatment process under the conditions including RF power of 500 W to 1000 W, a pressure of 1.0 torr to 3.0 torr, and a temperature range of 300° C. to 500° C.

14. The method of claim 12, comprising performing the plasma treatment process using He and N2 gases.

15. The method of claim 14, wherein the flow rate of He is in a range of 100 sccm to 500 sccm, and the flow rate of N2 is in a range of 100 sccm to 500 sccm.

16. The method of claim 1, comprising forming the metal line of tungsten (W).

17. The method of claim 16, comprising forming the metal line using a method selected from the group consisting of Low Rs W (LRW) methods, Pulsed Nucleation Layer (PNL) methods and Atomic Layer Deposition (ALD) methods.

18. The method of claim 17, comprising performing an LRW method using B2H6/WF6 and SiH4/WF6 as tungsten layer nuclei.

19. The method of claim 1, wherein the step of forming the third barrier metal layer on sidewalls of the trenches comprises:
   forming a third barrier metal layer on sidewalls of the trenches and over the second barrier metal layer; and
   removing the third barrier metal layer over the second barrier metal layer so that the third barrier metal layer remains only on sidewalls of the trenches.

* * * * *